United States Patent
Lee et al.

(10) Patent No.: US 6,518,612 B2
(45) Date of Patent: Feb. 11, 2003

(54) SEMICONDUCTOR MEMORY DEVICE USING HEMISPHERICAL GRAIN SILICON FOR BOTTOM ELECTRODES

(75) Inventors: Se-Min Lee, Ichon-shi (KR); Dong-Hwan Kim, Ichon-shi (KR); Keun-Il Lee, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/739,886

(22) Filed: Dec. 20, 2000

(65) Prior Publication Data

US 2001/0023102 A1 Sep. 20, 2001

(30) Foreign Application Priority Data

Dec. 30, 1999 (KR) .............................................. 99-66563

(51) Int. Cl.[7] .............................................. H01L 27/108
(52) U.S. Cl. ........................ 257/296; 257/300; 257/303; 257/306; 257/309; 257/905; 438/255; 438/398
(58) Field of Search ................................. 257/296, 298, 257/300, 303, 304, 306, 308, 309, 311, 905, 906, 908; 438/239, 253, 255, 396, 398

(56) References Cited

U.S. PATENT DOCUMENTS

| | | |
|---|---|---|
| 5,407,534 A | 4/1995 | Thakur |
| 5,629,223 A | 5/1997 | Thakur |
| 5,814,149 A | 9/1998 | Shintani et al. |
| 5,863,602 A | 1/1999 | Watanabe et al. |
| 6,015,986 A * | 1/2000 | Schuegraf .................... 257/303 |
| 6,037,220 A | 3/2000 | Chien et al. |
| 6,043,132 A | 3/2000 | Jung |
| 6,054,347 A | 4/2000 | Lin |
| 6,103,570 A | 8/2000 | Sandhu et al. |
| 6,121,081 A | 9/2000 | Thakur |
| 2001/0006837 A1 * | 7/2001 | Kwon et al. ................. 438/396 |
| 2001/0030846 A1 * | 10/2001 | Kim et al. ................ 361/306.1 |

* cited by examiner

*Primary Examiner*—Olik Chaudhuri
*Assistant Examiner*—Jack Chen
(74) *Attorney, Agent, or Firm*—Jacobson Holman PLLC

(57) ABSTRACT

A semiconductor device for use in a memory cell including an active matrix provided with a silicon substrate, at least one transistor formed on the silicon substrate, a number of bottom electrodes formed over the transistors, a plurality of conductive plugs to electrically connect the bottom electrodes to the transistors, respectively, and an insulating layer formed around the conductive plugs. In the device, by carrying out a carbon treatment to top surface portions of the bottom electrode structure, it is possible to secure enough space to prevent the formation of bridges between the bottom electrodes.

3 Claims, 14 Drawing Sheets

SEMICONDUCTOR MEMORY DEVICE USING HEMISPHERICAL GRAIN SILICON FOR BOTTOM ELECTRODES

FIELD OF THE INVENTION

The present invention relates to a semiconductor device and, more particularly, to a semiconductor memory device incorporating textured electrodes for implementing a high-density storage capacitor and a method for the manufacture thereof.

DESCRIPTION OF THE PRIOR ART

As is well known, a dynamic random access memory (DRAM) with at least one memory cell comprised of a transistor and a capacitor has a higher degree of integration mainly due to down-sizing through micronization. However, there is still a demand for downsizing the area of the memory cell.

To meet the demand, several methods have been proposed such as a trench type or a stack type capacitor, which is arranged three-dimensionally in a memory device to reduce the cell area available to the capacitor. However, the process of manufacturing a three-dimensionally arranged capacitor is a long and tedious one and consequently incurs high manufacturing costs. Therefore, there is a strong demand for a memory device that can reduce the cell area while securing a requisite volume of information without requiring complex manufacturing steps.

In an attempt to meet the demand, a high-density dynamic random access memory (DRAM) which incorporates bottom electrodes having textured surface morphology has been proposed. FIG. 1 is a cross sectional view setting forth a conventional high-density semiconductor memory device 100 as disclosed in U.S. Pat. No. 6,015,986, entitled "RUGGED METAL ELECTRODES FOR METAL-INSULATOR-METAL CAPACITORS". The semiconductor memory device 100 includes an active matrix 10 incorporating metal oxide semiconductor (MOS) transistors therein, with a bottom electrode 25 of a capacitor structure formed on top of the active matrix 10.

FIGS. 2A to 2F illustrate prior art manufacturing steps involved in manufacturing a semiconductor memory device 100.

As shown in FIG. 2A, the process for manufacturing a semiconductor memory device 100 according to the prior art begins with the preparation of an active matrix 10 having a silicon substrate 2, the MOS transistors formed thereon, an isolation region 4, a bit line 18 formed between the MOS transistors, a pair of poly plugs 16, word lines 20 formed on top of the isolation region 4 and a first insulating layer 22 formed on top of the MOS transistors. The insulating layer 22, e.g., made of boron-phosphor-silicate glass (BPSG), is formed over the entire surface by chemical vapor deposition (CVD). The MOS transistor includes a pair of diffusion regions 6 serving as a source and a drain, a gate oxide 8, a spacer 14 and a gate line 12.

In a subsequent step, shown in FIG. 2B, a sacrificial layer 24, which may be made of a material such as phosphosilicate (PSG), is formed on top of the active matrix 10 and patterned into a predetermined configuration, thereby opening top portions of the poly plugs 16. In an ensuing step, a conductive layer 28, which may be made of a polysilicon, is formed on top of the patterned sacrificial layer 24 and the active matrix 10, as shown in FIG. 2C.

Thereafter, the top-most portions of the conductive layer 28 are removed by a planarizing process such as a chemical mechanical polishing (CMP) or an anisotrophic etching until the sacrificial layer 24 is exposed. Next, the sacrificial layer 24 is removed by using a method such as a wet etching, thereby obtaining electrode structures 25, as shown in FIG. 2D.

In a next step, shown in FIG. 2E, the electrode structure 25 is subjected to a high vacuum anneal to form hemispherical grained (HSG) polysilicons 26 on surfaces thereof. Rapid thermal processing (RTP) may be used at high vacuum to further promote HSG formation.

One of the major shortcomings of the above-described semiconductor memory device 100 is that it is very possible to form HSG polysilicons bridges between outsides of neighboring electrode structures since the upper HSG polysilicons 32, formed on top of the electrode structure 25, are easily detached from the electrode structure 25. The detached upper HSG polysilicons 32 may fall into a spacing between adjacent electrode structures and short each other.

SUMMARY OF THE INVENTION

It is, therefore, an object of the present invention to provide a semiconductor device incorporating a plurality of electrodes provided with rugged side surfaces and a rugged bottom surface, wherein the rugged side surfaces are inclined at a predetermined angle with respect to the rugged bottom surface.

It is another object of the present invention to provide a method for manufacturing a semiconductor device incorporating a plurality of electrodes provided with rugged side surfaces and a rugged bottom surface, wherein the rugged side surfaces are inclined at a predetermined angle with respect to the rugged bottom surface.

In accordance with one aspect of the present invention, there is provided a semiconductor device, comprising an active matrix provided with a semiconductor substrate, a plurality of transistors formed on the semiconductor substrate and conductive plugs electrically connected to the transistors; and a number of bottom electrodes formed on top of the active matrix with rugged side and bottom surfaces.

In accordance with another aspect of the present invention, there is provided a method for manufacturing a semiconductor device, the method comprising the steps of a) preparing an active matrix provided with at least one transistor, a plurality of conductive plugs electrically connected to the transistors, and a first insulating layer formed around the conductive plugs; b) forming a sacrificial layer on top of the active matrix and patterning the sacrificial layer into a predetermined configuration, thereby obtaining a patterned sacrificial layer; c) forming spacers on the sides of the patterned sacrificial layer; d) forming a conductive layer on top of the patterned sacrificial layer, the spacers and the active matrix; e) forming a photoresist layer on top of the conductive layer; f) planarizing portions of the photoresist layer and the conductive layer placed on top of the patterned sacrificial layer until the patterned sacrificial layer is exposed, thereby opening portions of the conductive layer; g) carrying out a carbon treatment on the opened conductive layer; h) removing the sacrificial layer and the photoresist layer, thereby obtaining bottom electrode structures; and i) forming hemispherical grained (HSG) polysilicon on side and bottom surfaces of the bottom electrode structures.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
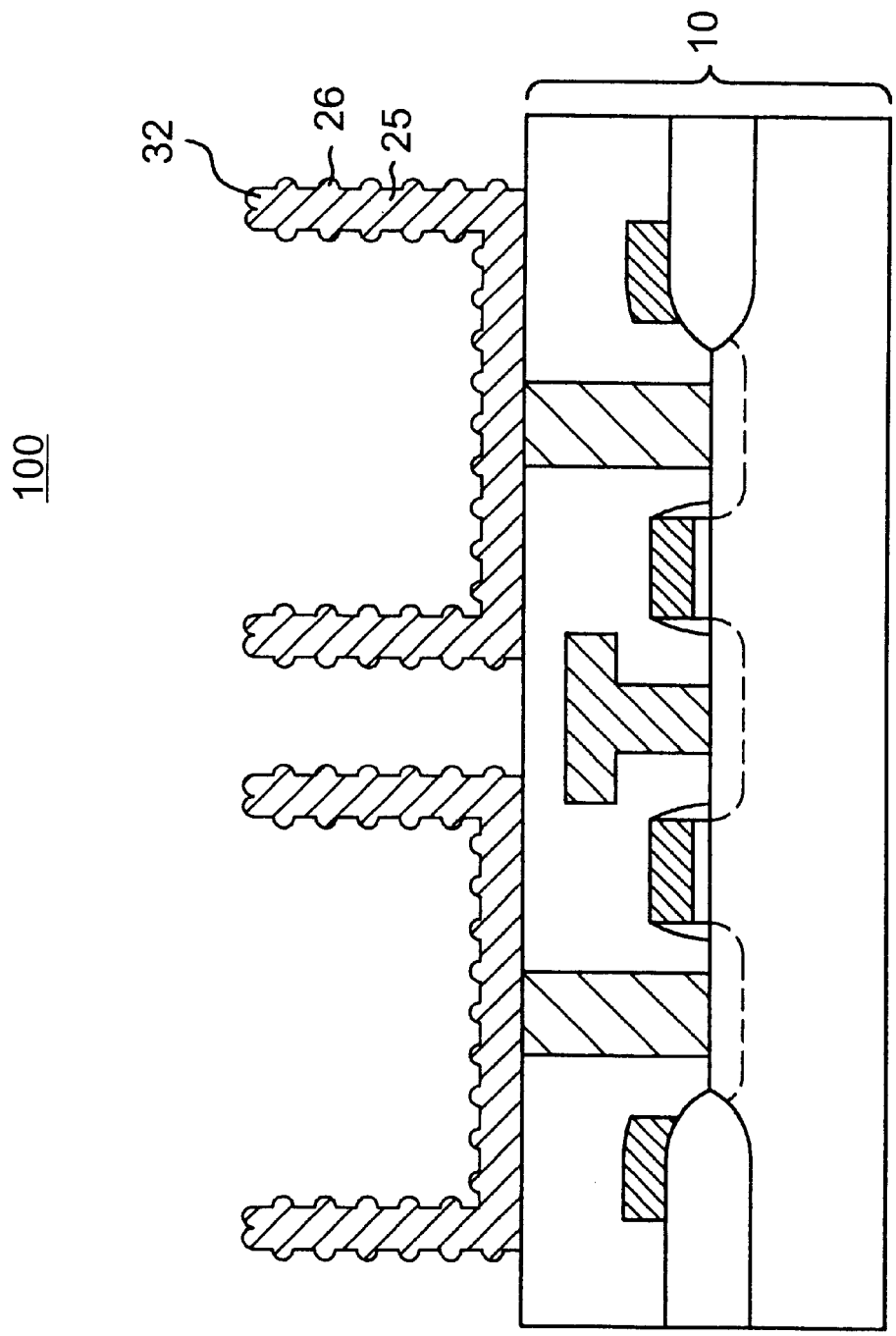
FIG. 1 shows a cross sectional view representing a prior art semiconductor memory device having textured electrodes.
Figure 2A:
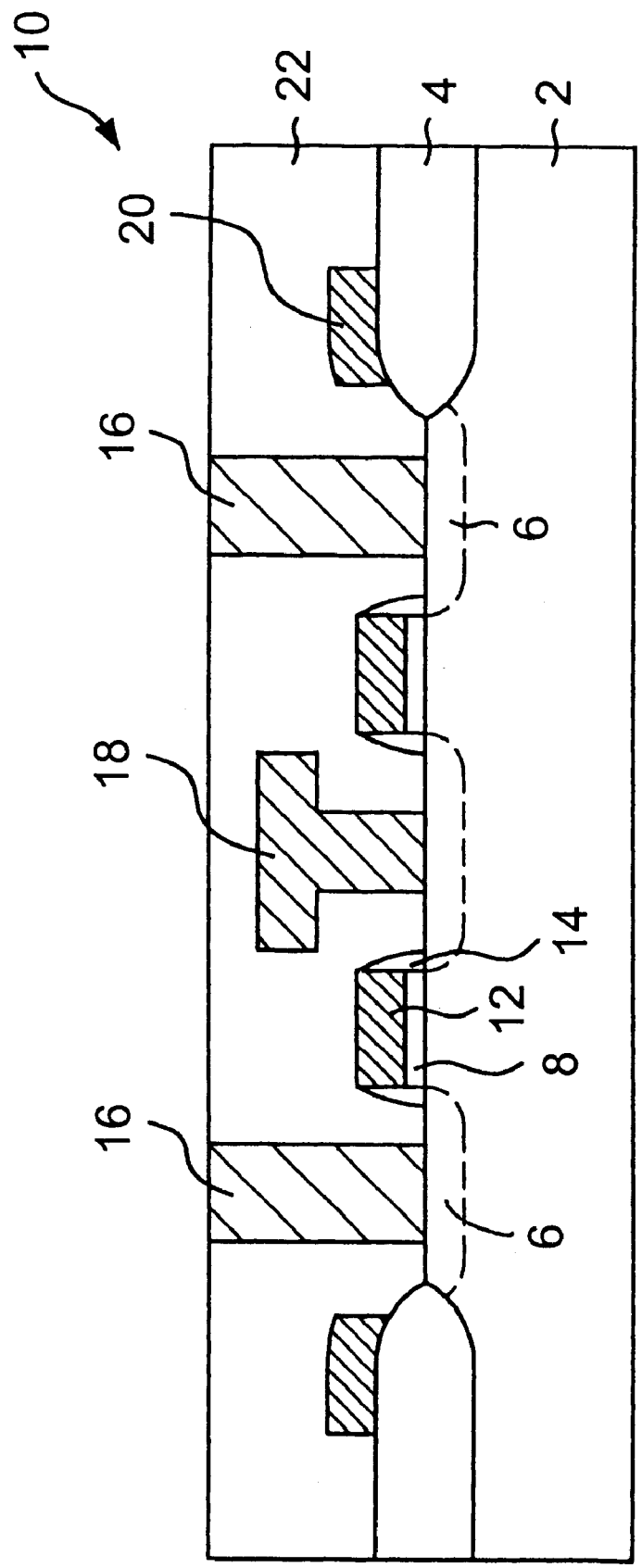
FIGS. 2A to 2E are schematic cross sectional views illustrating a prior art method for the manufacture of a semiconductor memory device.
Figure 2B:
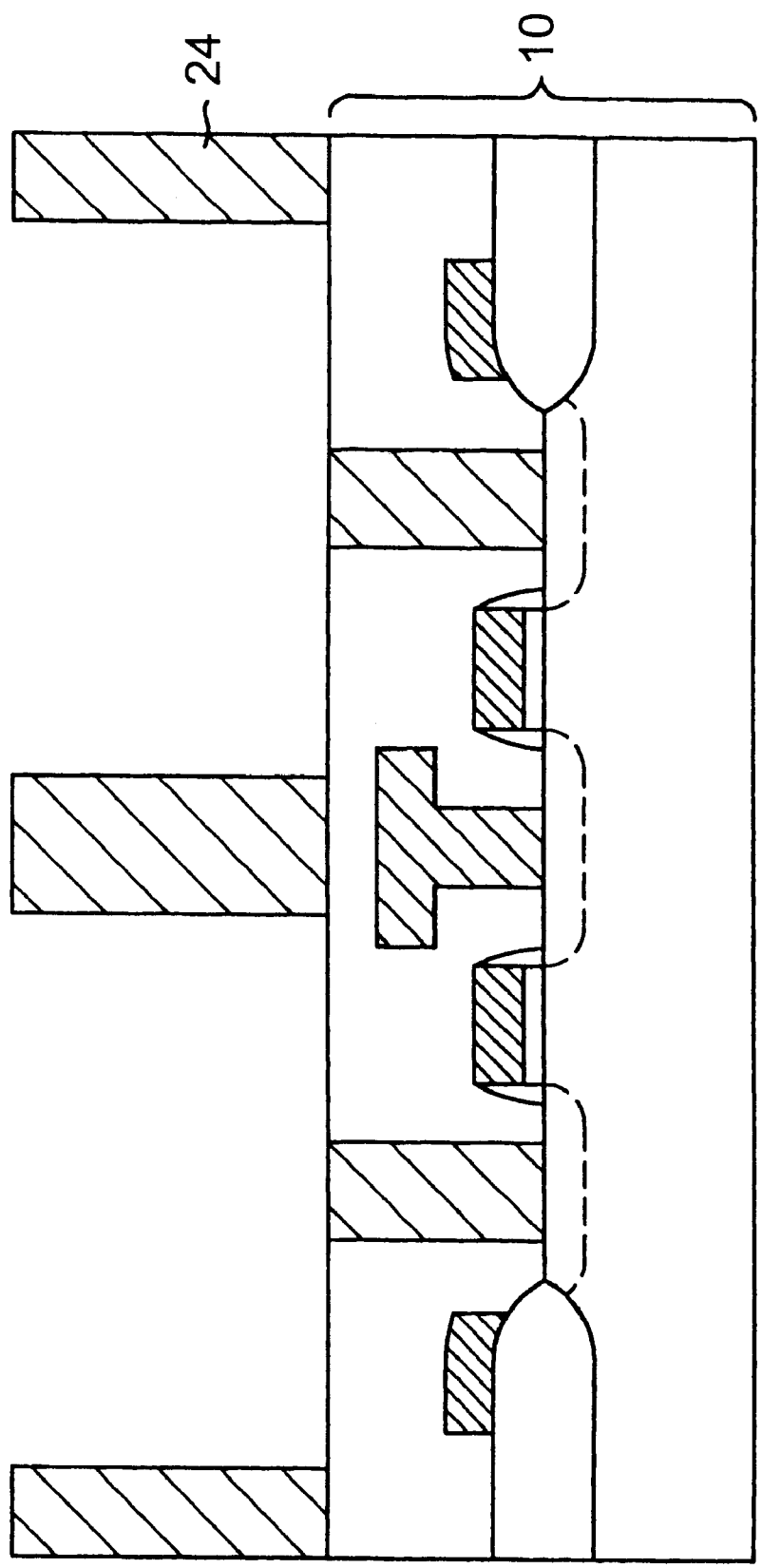
Figure 2C:
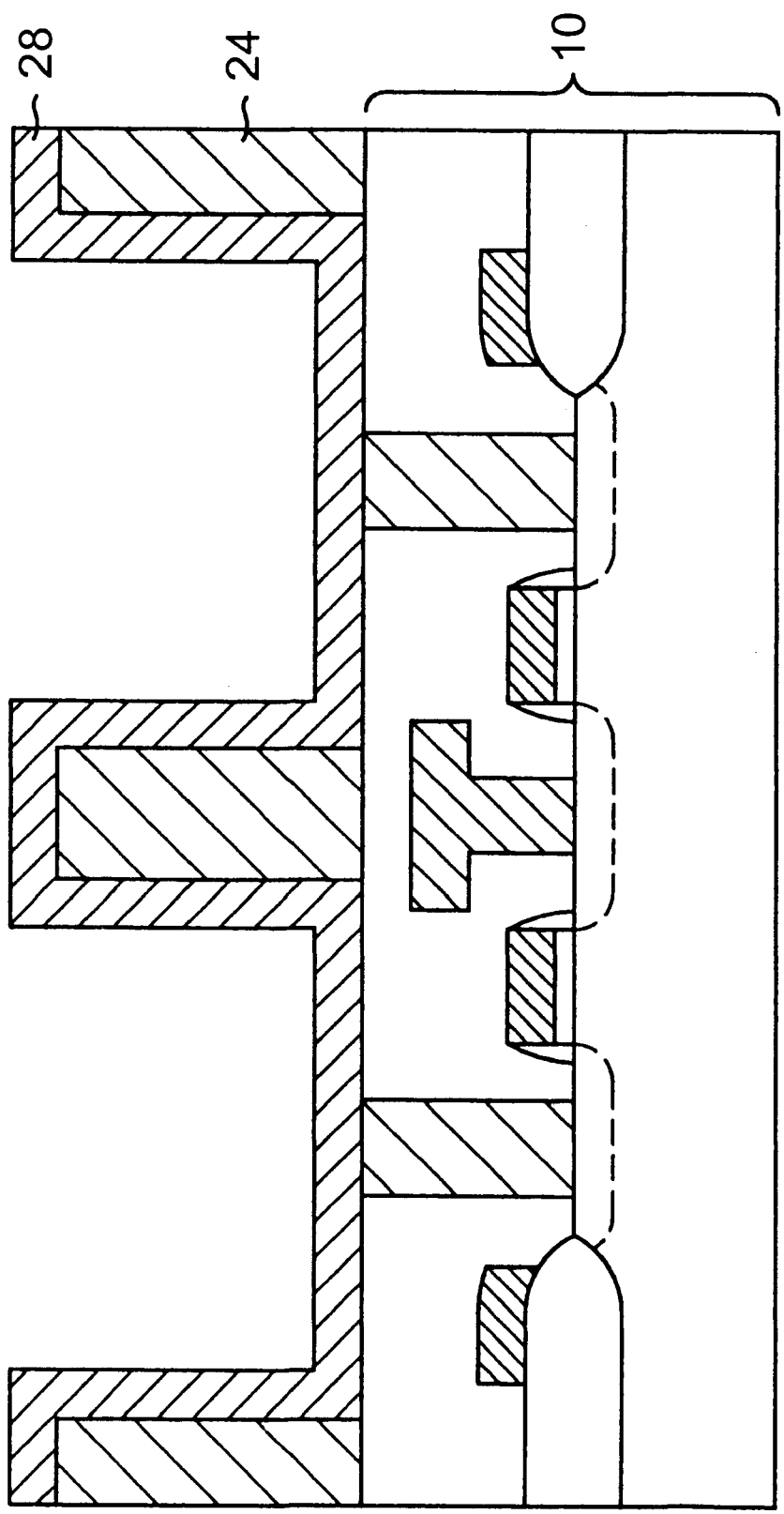
Figure 2D:
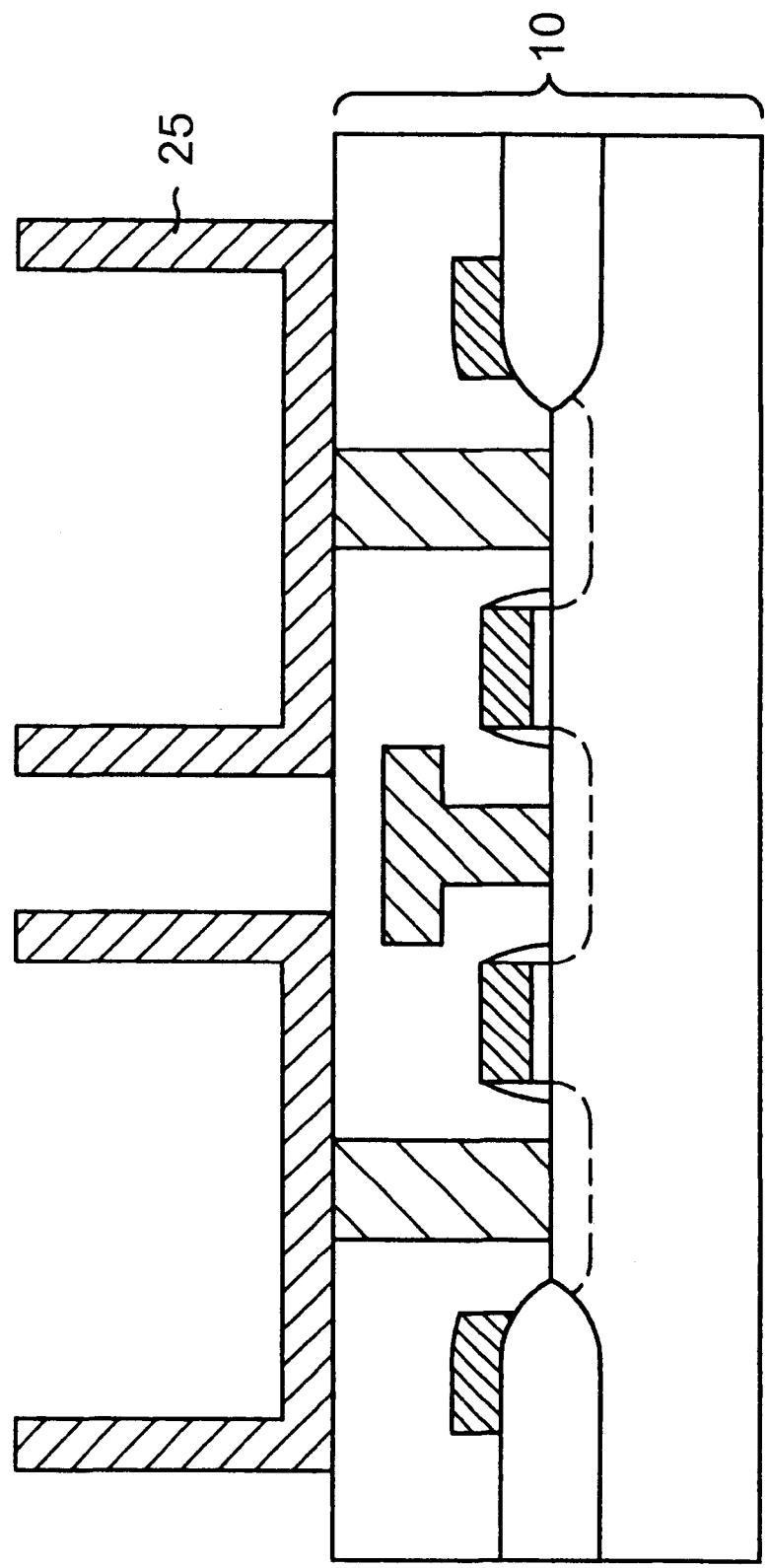
Figure 2E:
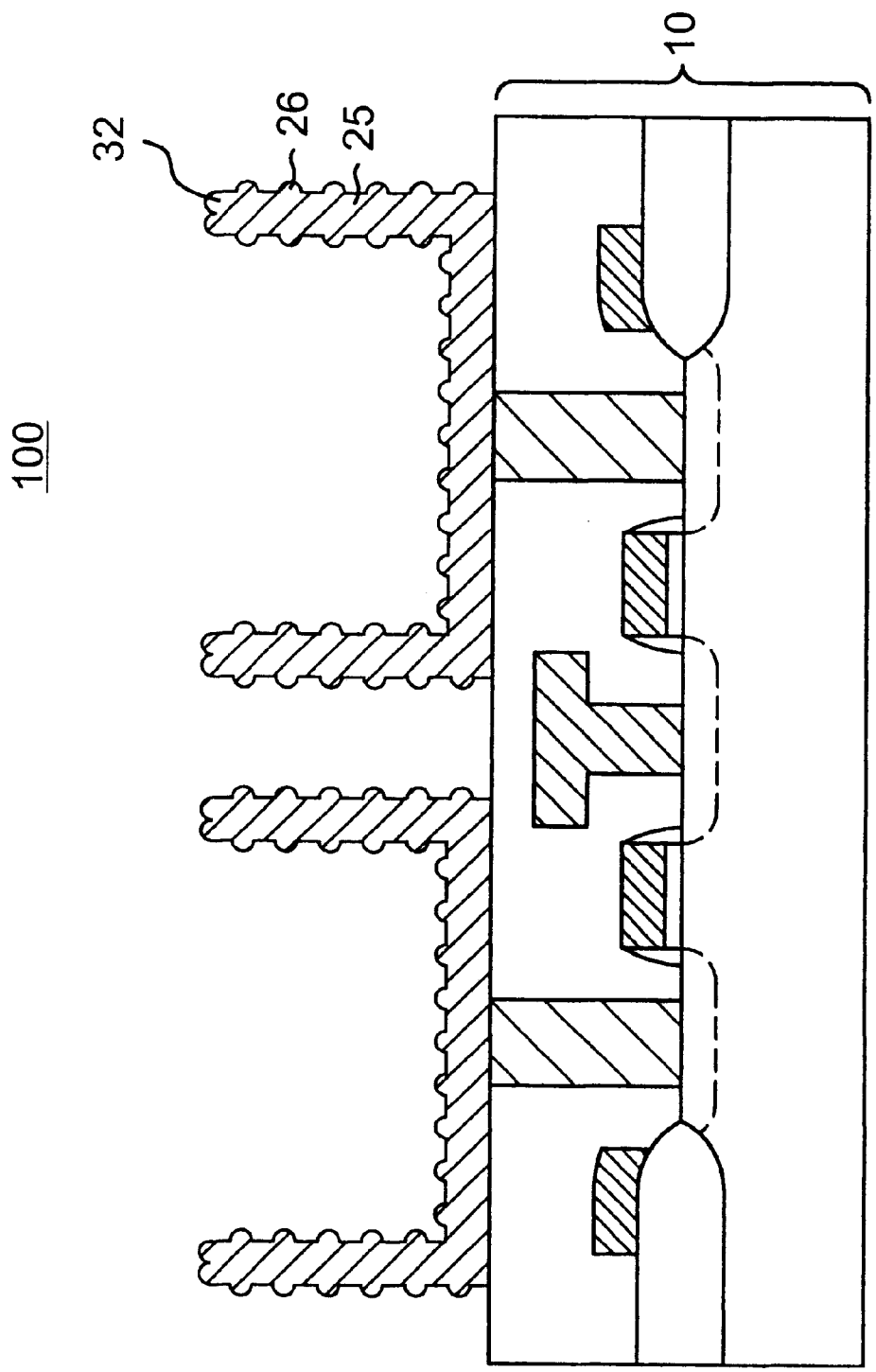

There are provided in FIG. 3 and FIGS. 4A to 4G a cross sectional view of a semiconductor device 200 for use in a memory cell, and cross sectional views setting forth a method for the manufacture thereof in accordance with preferred embodiments of the present invention. It should be noted that like parts appearing in FIG. 3 and FIGS. 4A to 4G are represented by like reference numerals.

Figure 3:
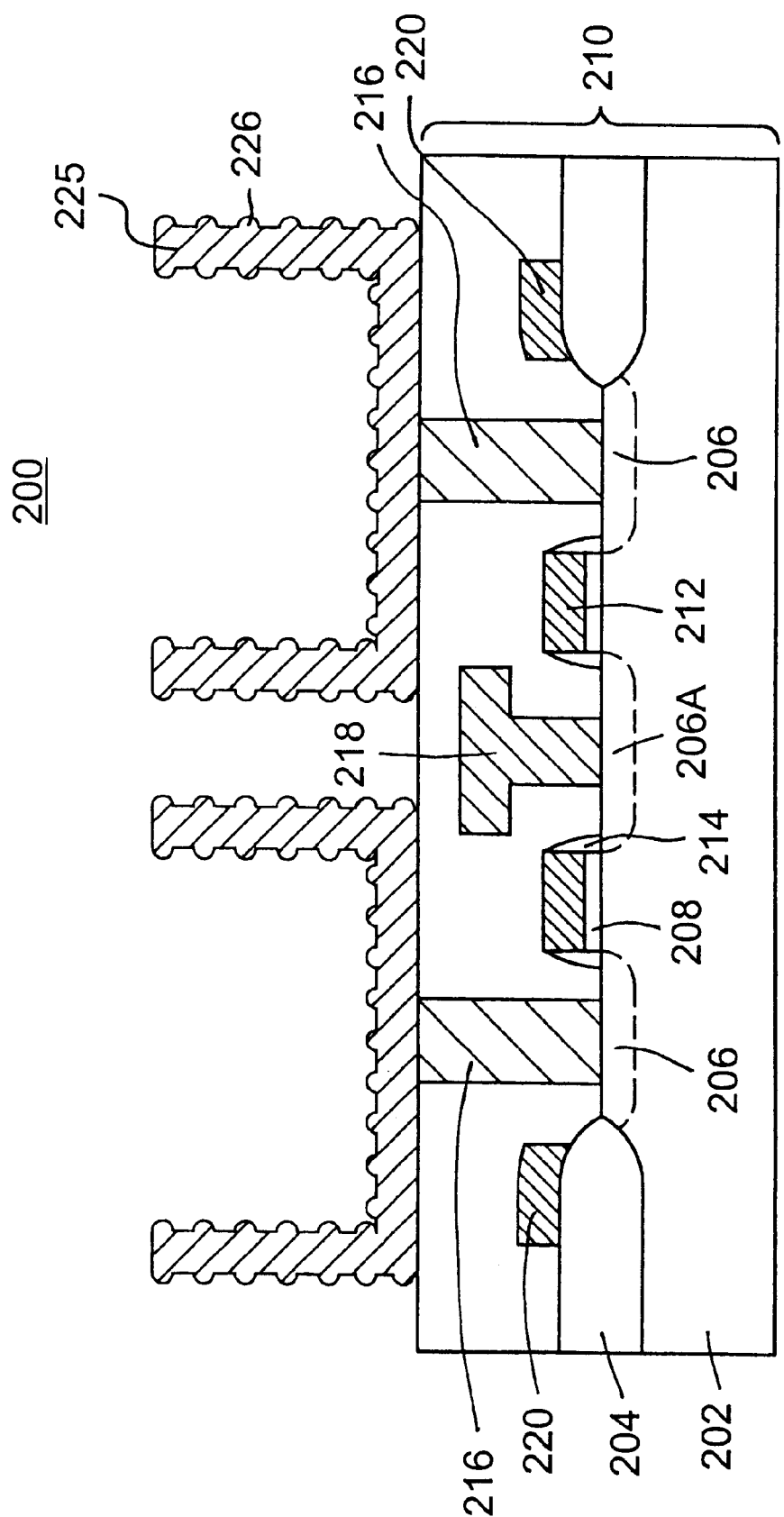
FIG. 3 is a cross sectional view setting forth a semiconductor device in accordance with the present invention.

In FIG. 3, there is provided a cross sectional view of the inventive semiconductor device 200 comprising an active matrix 210 and electrode structures 225. It is preferable that the electrode structures 225 are made of a material such as polysilicon, amorphous silicon (a-Si) or the like. Each of the electrode structures 225 has a rugged or textured surface 226 to enlarge the electrode surface area without increasing the lateral dimensions thereof. In the preferred embodiment, top portions of the electrode structures 225 are not textured in order to prevent the electrode structures 225 from bridging with each other.

The active matrix 210 includes a silicon substrate 202, transistors formed on top of the silicon substrate 202, an isolation region 204 for isolating the transistors, poly plugs 216, a bit line 218 and word lines 220. Each of the transistors has diffusion regions 206, a gate oxide 208, a gate line 212 and a side wall 214.

In the semiconductor device 200, the bit line 218 is electrically connected to diffusion region 206A to apply an electric potential. Each of the electrode structures 225 is electrically connected to the other diffusion regions 206 through the poly plugs 216. Although the bit line 218 actually extends in right and left directions bypassing the poly plugs 216, the drawing does not show these parts of the bit line 218. The electrode structure 225 can be connected to a plate line (not shown) to apply thereto a common constant potential.

FIGS. 4A to 4G are schematic cross sectional views setting forth the method for manufacture of a semiconductor memory device 200 in accordance with the present invention.

Figure 4A:
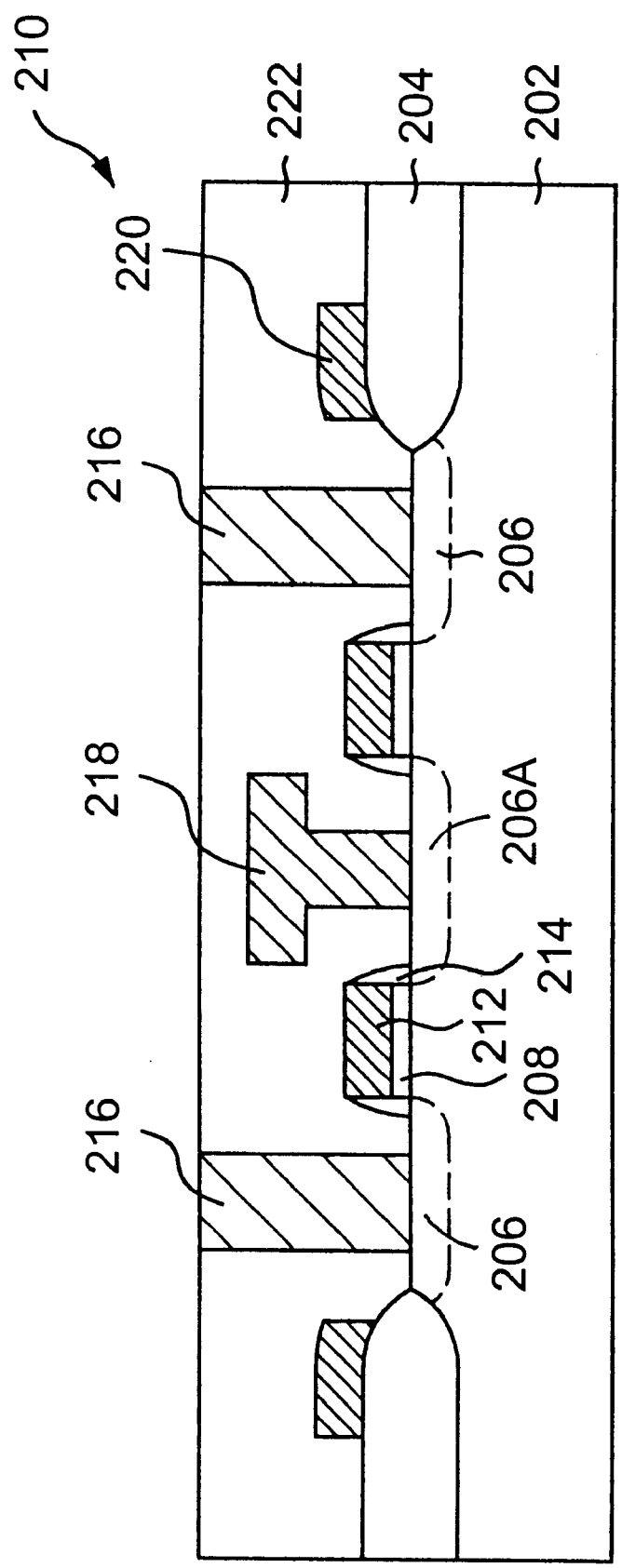
FIGS. 4A to 4G are schematic cross sectional views setting forth a method for the manufacture of the semiconductor memory device in accordance with the present invention.

The process for manufacturing the semiconductor device 200 begins with the preparation of an active matrix 210 including a silicon substrate 202, an isolation region 204, diffusion regions 206, gate oxides 208, gate lines 212, side walls 214, a bit line 218, poly plugs 216 and an insulating layer 222, as shown in FIG. 4A. The bit line 218 is electrically connected to diffusion region 206A to apply an electric potential. Each of the poly plugs 216 is electrically connected to the other diffusion regions 206, respectively. Although the bit line 218 actually extends in right and left directions bypassing the poly plugs 216, the drawing does not show these parts of the bit line 218. The electrode structure 225 can be connected to a plate line (not shown) to apply thereto a common constant potential. The insulating layer 222 is made of a material, e.g., boron-phosphor-silicate glass (BPSG).

Figure 4B:
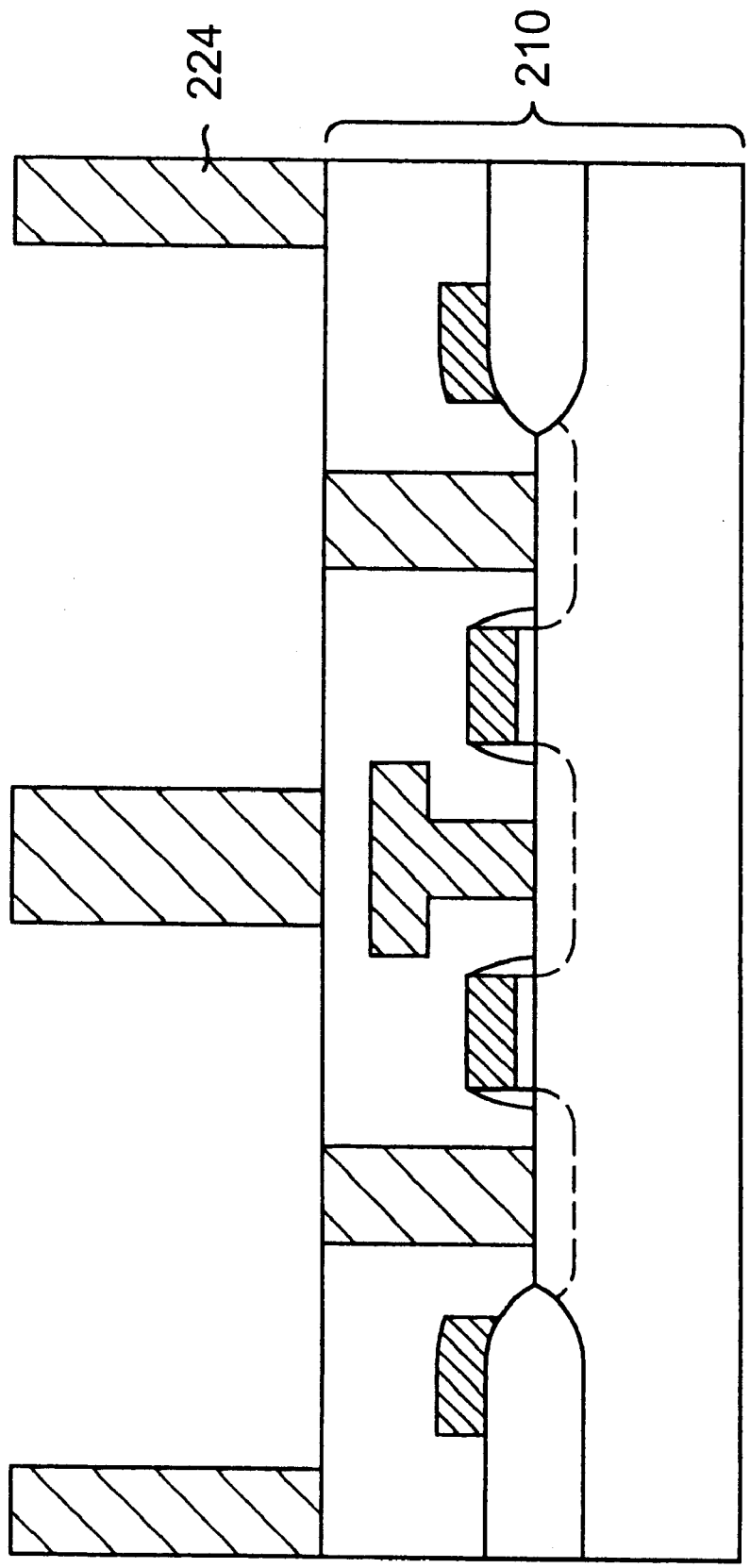

In an ensuing step, a sacrificial layer, e.g., made of $O_3$-PSG, is formed on top of the active matrix 210 by using a plasma enhanced chemical vapor deposition (PECVD) and patterned into a predetermined configuration, thereby obtaining a patterned sacrificial layer 224, as shown in FIG. 4B. It should be noted that a nitride layer (not shown) can be formed on top of the active matrix 210 as an etch stop layer before the formation of the sacrificial layer.

Optionally, spacers (not shown), which may be made of silicon dioxide ($SiO_2$), are formed on sides of the patterned sacrificial layer 224 by using a hot thermal oxidation (HTO). The spacers may be formed by using a medium temperature deposition of oxide (MTO).

Figure 4C:
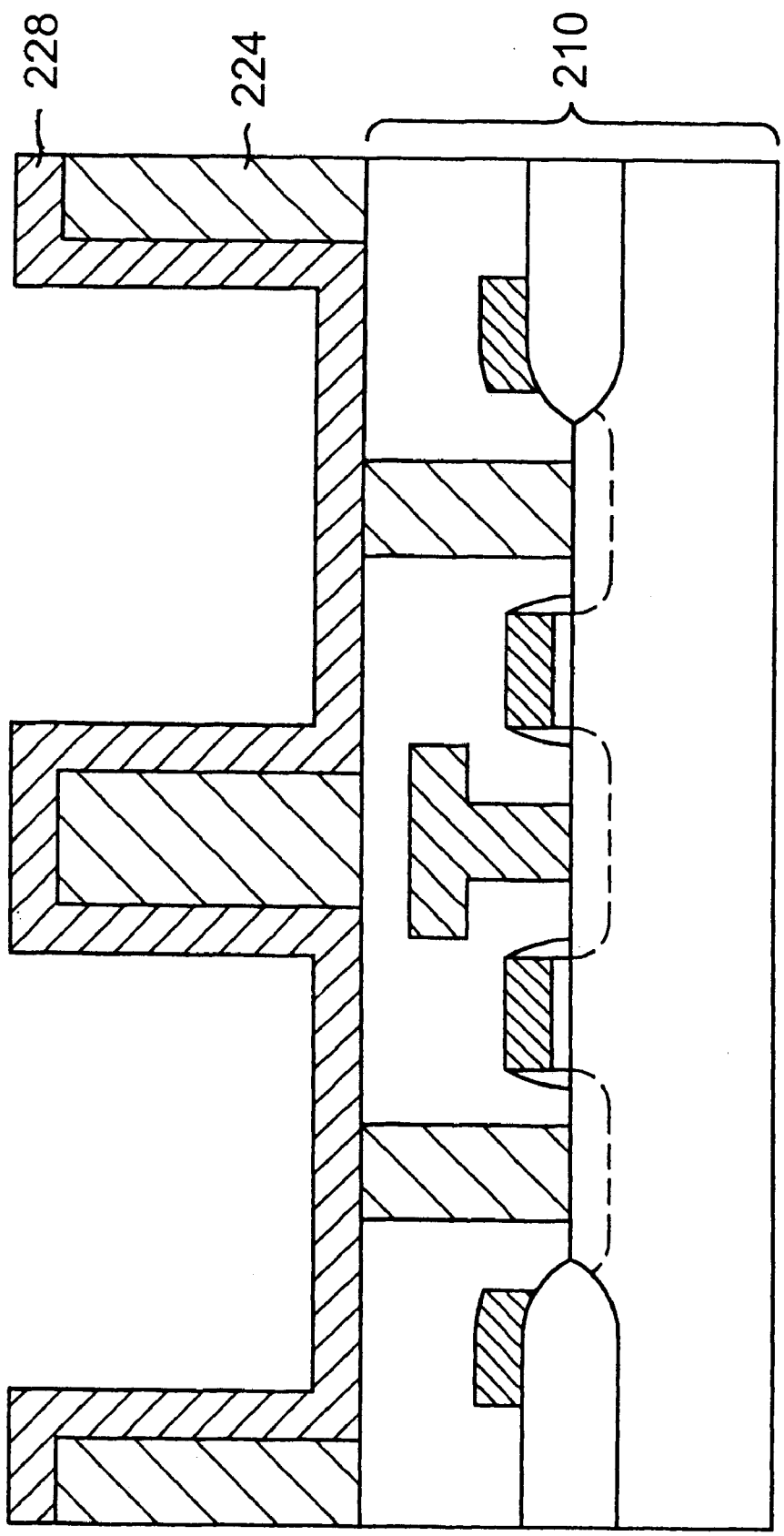

In a following step, a conductive layer 228, which may be made of a polysilicon, is formed on top of the patterned sacrificial layer 224 and the active matrix 210, as shown in FIG. 4C. In the preferred embodiment, the conductive layer 228 has a thickness ranging from approximately 400 Å to approximately 500 Å.

Figure 4D:
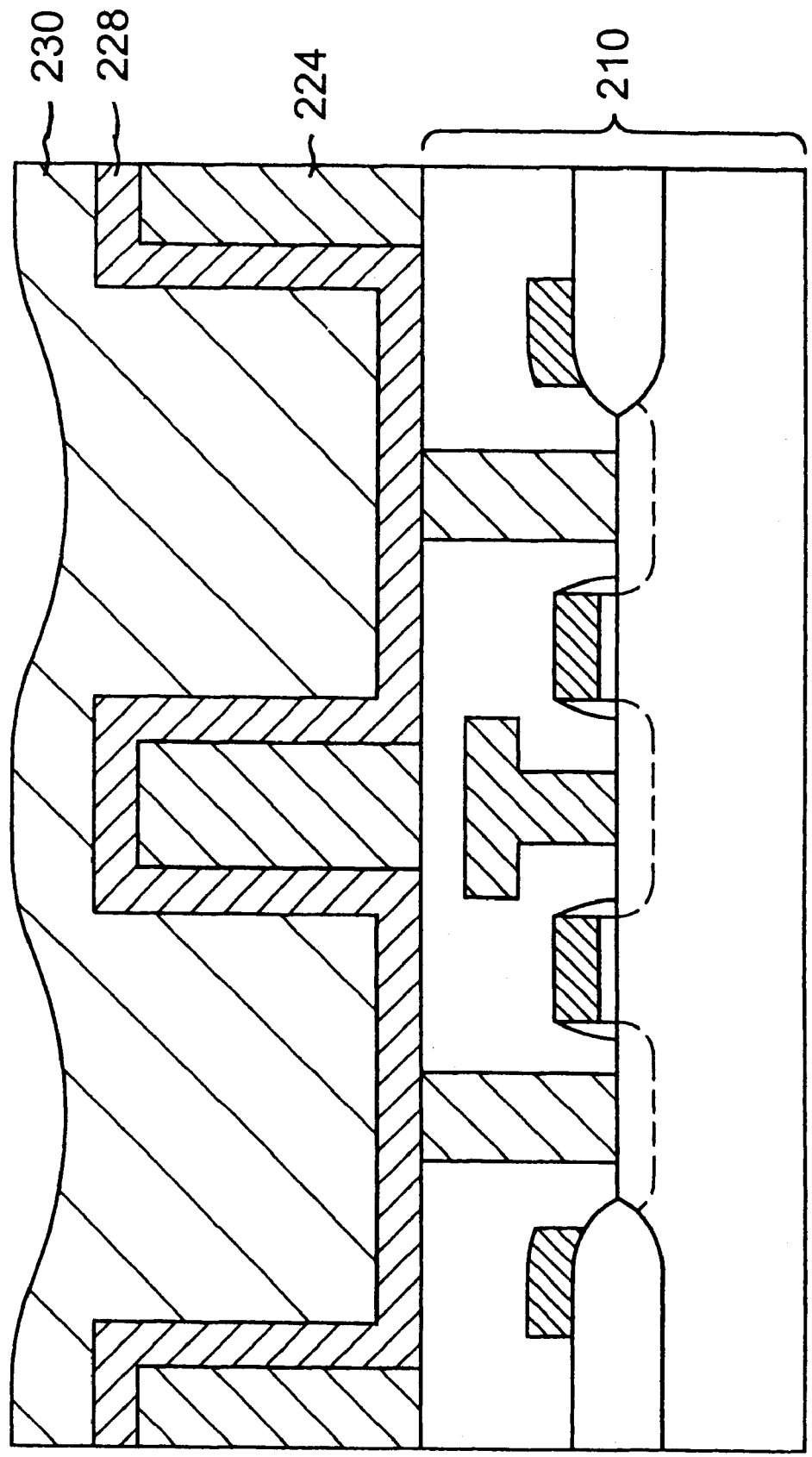

Thereafter, a photoresist layer 230 is formed on the entire surface of the conductive layer 228. The photoresist layer has a thickness ranging from approximately 8,000 Å to approximately 15,500 Å, as shown in FIG. 4D.

Figure 4E:
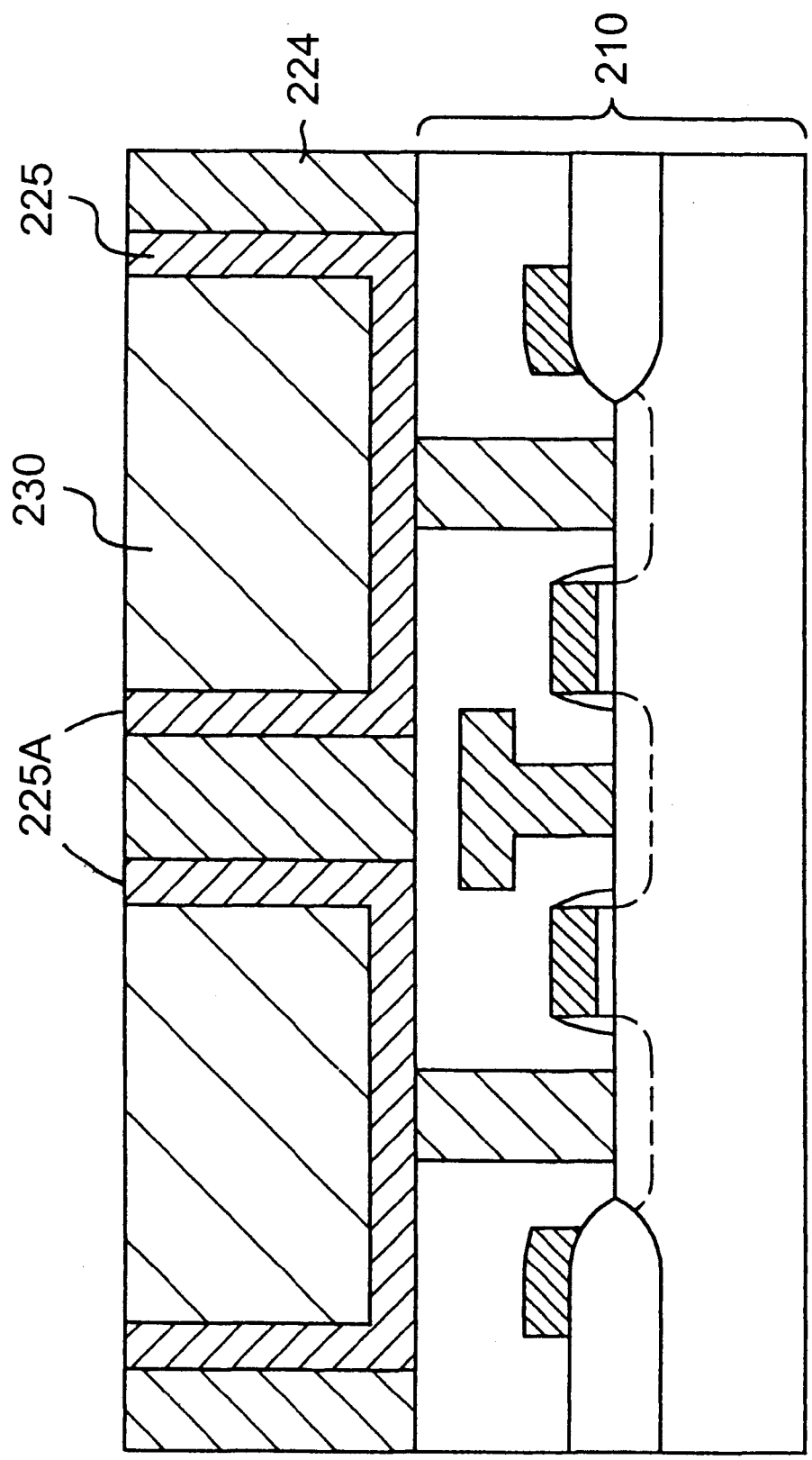

The photoresist layer 230 and the conductive layer 228 are then planarized by using a method such as a chemical mechanical polishing (CMP) or the like until the patterned sacrificial layer 224 is exposed, thereby obtaining bottom electrode structures 225, as shown in FIG. 4E. Alternatively, the photoresist layer 230 and the conductive layer 228 can be etched back by using a method such as a reactive ion etching (RIE).

In an ensuing step, a carbon treatment process is carried out on exposed portions 225A of the bottom electrode structures 225 so as to prevent HSGs from forming on the exposed portions. The carbon treatment process is carried out below 200 mTorr by using $CF_4$ as a main gas. In this process, an Ar gas or a CO gas is utilized as a carrier gas.

Figure 4F:
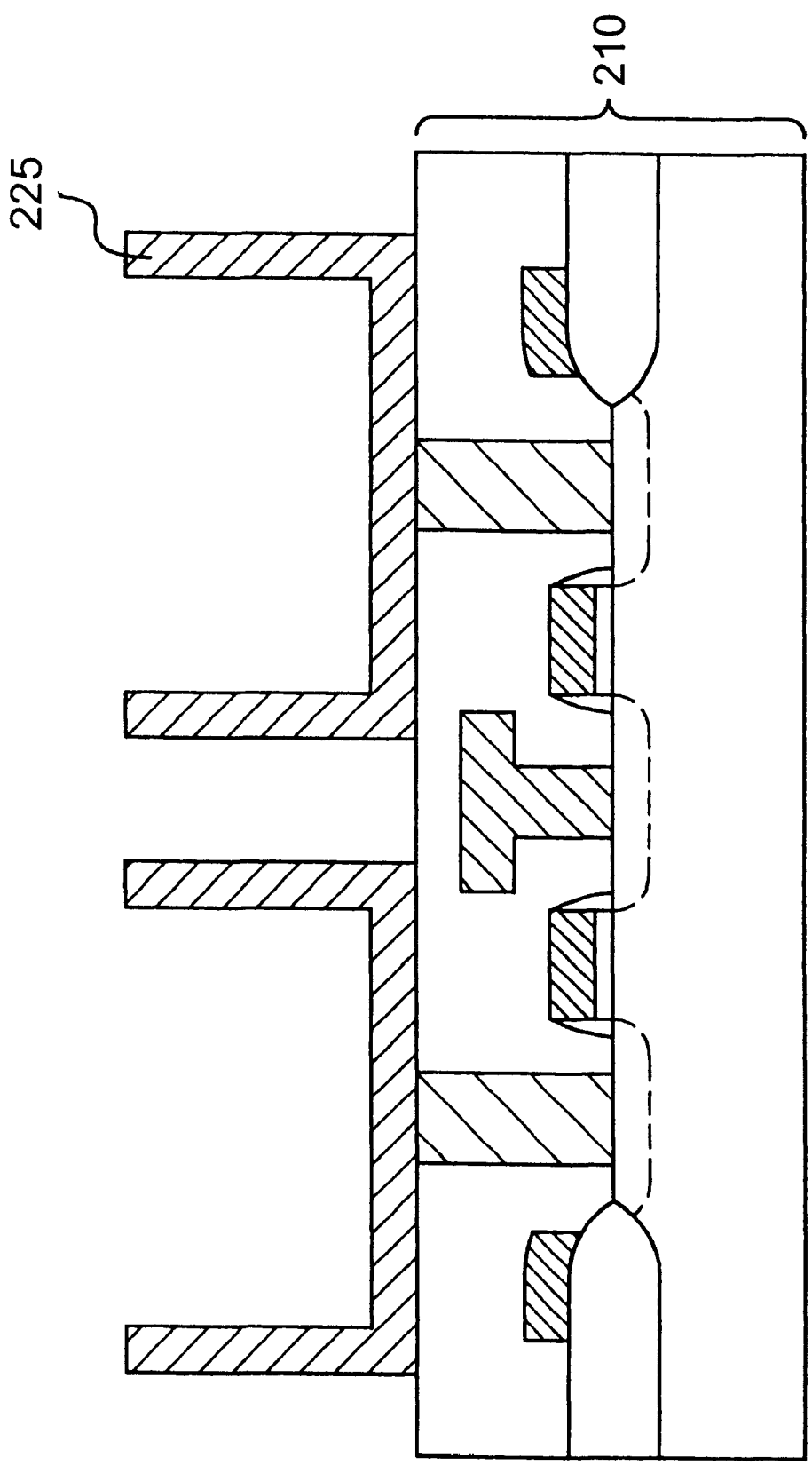

In the next step, the patterned sacrificial layer 224 and the photoresist layer 230 are removed by using a wet etching, as shown in FIG. 4F.

Figure 4G:
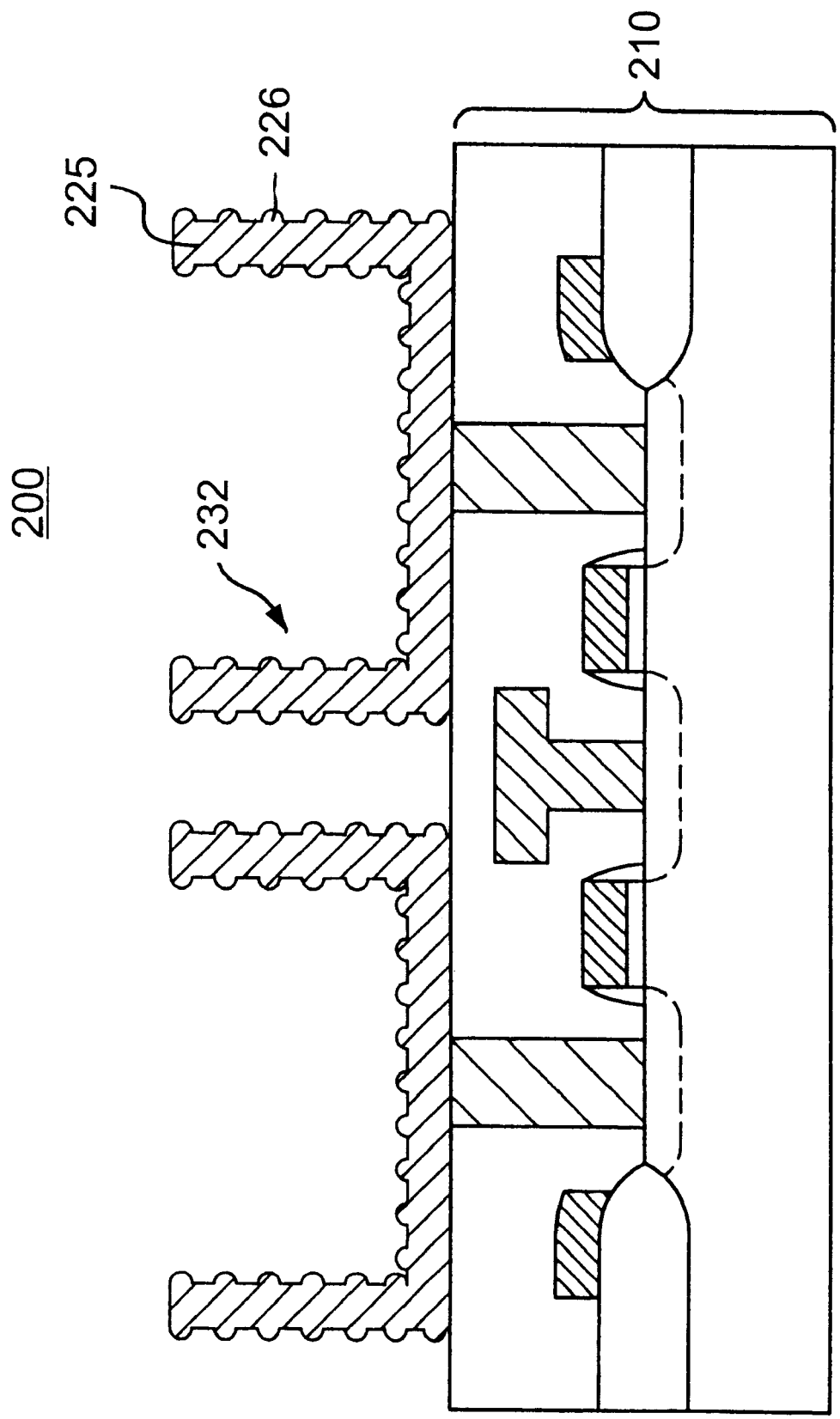

Finally, seeding and annealing processes are carried out on the electrode structures 225 to produce a rugged surface 226 which has relatively large polycrystalline silicon grains with a diameter of about 50 nm to about 250 nm, thereby obtaining bottom electrodes 232, as shown in FIG. 4G. The annealing process can include the step of dispersing a material such as polysilicon or silicon dioxide onto the surfaces of the electrode structures 225 for producing nucleation sites. The annealing process can also include the step of accumulating silicon at the nucleation sites, thereby forming the rugged surface 226 having a rough surface morphology. The resulting surface morphology is usually comprised of relatively large polycrystallites, referred to as hemispherical grained (HSG) silicon. Other steps can be performed in order to utilize the bottom electrodes 232 in a ferroelectric random access memory (FeRAM) device.

In comparison with the prior art, the present invention can secure enough space to prevent the formation of bridges between the bottom electrodes 232 caused by the formation of HSGs. This is achieved by carrying out the aforementioned carbon treatment to top surface portions 225A of the electrode structure 225.

While the present invention has been described with respect to the particular embodiments, it will be apparent to those skilled in the art that various changes and modifications may be made without departing from the scope of the invention as defined in the following claims.

What is claimed is:

1. A semiconductor device, comprising:

an active matrix provided with a semiconductor substrate, a plurality of transistors formed on the semiconductor substrate and conductive plugs electrically connected to the transistors; and a number of bottom electrodes formed on top of the active matrix, wherein each of the bottom electrodes includes rugged side and bottom surfaces and a plain top surface that is treated with carbon.

2. The semiconductor device of claim 1, wherein the bottom electrodes are made of an amorphous silicon.

3. The semiconductor device of claim 2, wherein the rugged side and bottom surfaces have a hemispherical grained (HSG) silicon.

* * * * *